United States Patent [19]

Sanders

[11] 4,373,141
[45] Feb. 8, 1983

[54] FAST UPDATING PEAK DETECTOR CIRCUIT

[75] Inventor: David E. Sanders, St. Petersburg, Fla.

[73] Assignee: E-Systems, Inc., Dallas, Tex.

[21] Appl. No.: 227,254

[22] Filed: Jan. 22, 1981

[51] Int. Cl.³ .............. H03K 5/153; G11C 27/02; G01R 19/04
[52] U.S. Cl. .................. 307/351; 307/353; 328/151
[58] Field of Search .............. 307/351, 352, 353; 328/150, 151, 115, 116, 117

[56] References Cited

U.S. PATENT DOCUMENTS

| | | |
|---|---|---|
| 3,659,211 | 4/1972 | Norton . |
| 3,699,948 | 10/1972 | Ota et al. . |
| 3,710,141 | 1/1973 | Zeiger . |
| 3,835,400 | 9/1974 | Briscoe ............................. 307/351 |
| 3,969,683 | 7/1976 | Fabricius . |
| 4,031,479 | 6/1977 | Thomas, Jr. et al. . |
| 4,160,175 | 7/1979 | Trout . |

Primary Examiner—John Zazworsky
Attorney, Agent, or Firm—Robert V. Wilder; Albert M. Crowder, Jr.

[57] ABSTRACT

A peak detector circuit (10) is disclosed wherein an input signal is full-wave rectified by a circuit (14) and the rectified signal is provided simultaneously to peak detect, hold and dump circuits (18), (20). Each of the peak detect, hold and dump circuits is discharged at the start of periodic intervals with a phase offset between the intervals for the two circuits. The peak signals are discharged at essentially the start of the interval followed by rapid charging of the peak signal to the peak amplitude of the rectified input signal. The later portions of each of the intervals of the peak signals produced by the peak detect, hold and dump circuits (18) and (20) are transmitted alternately through a multiplexer circuit (24). The resulting output signal is transmitted through a high impedance buffer amplifier (30) to an output terminal (32) of peak detector circuit (10). The timing of the operation of multiplexer (24) serves to remove the discharge and charge transitions of the peak signals from the peak detected output signal.

13 Claims, 3 Drawing Figures

FAST UPDATING PEAK DETECTOR CIRCUIT

TECHNICAL FIELD

The present invention pertains to electronic detector circuits and more particularly to such circuits for detecting the peak amplitude of a signal.

BACKGROUND ART

Peak detector circuits are generally an integral part of automatic gain control (AGC) loops. There are basically two types of peak detector circuits which are used in AGC loops. The first type is a fast charge and slow discharge peak detector and the second type is an averaging detector. The fast charge, slow discharge detector reacts quickly to a signal which is increasing in amplitude, but reacts slowly to a signal which is decreasing in amplitude. The averaging detector, on the other hand, reacts slowly to both increasing and decreasing amplitudes of an input signal.

In certain applications it is desired to have a peak detector which reacts quickly to both an increasing amplitude and a decreasing amplitude of the input signal. This is essentially a requirement that the peak detector rapidly follow the amplitude of the input signal. Conventional peak detectors work best with input signals which have equal energy in each bit. But when the input signal does not have equal energy in each bit, such as with phase shift keyed (PSK) signals, an averaging detector produces a noisy output signal.

Therefore, there exists a need for a peak detector which rapidly follows both increasing and decreasing amplitudes of an input signal and is not affected by an input signal which does not have equal energy distribution for each of the bits.

DISCLOSURE OF THE INVENTION

A peak detector circuit is disclosed for following input signals which have rapidly increasing and rapidly decreasing signal amplitudes. The peak detector includes a rectifier for receiving an input signal to produce a rectified signal therefrom. A first detect, hold and dump circuit, detects the peak amplitude of the rectified signal to produce a first peak signal therefrom. A second detect, hold and dump circuit, receives the rectified signal and detects the peak amplitude thereof to produce a second peak signal. The peak signals are alternately and periodically reset by being pulled to a preset level, ground, and then permitted to recharge to the peak amplitude of the rectified signal. Switching circuits are provided to alternately connect the first and second peak signals to an output terminal wherein neither of the peak signals is reset when connected to the output terminal.

BRIEF DESCRIPTION OF DRAWINGS

For a more complete understanding of the present invention and the advantages thereof, reference is now made to the following description taken in conjunction with the accompanying drawings in which.

DETAILED DESCRIPTION

Figure 1:
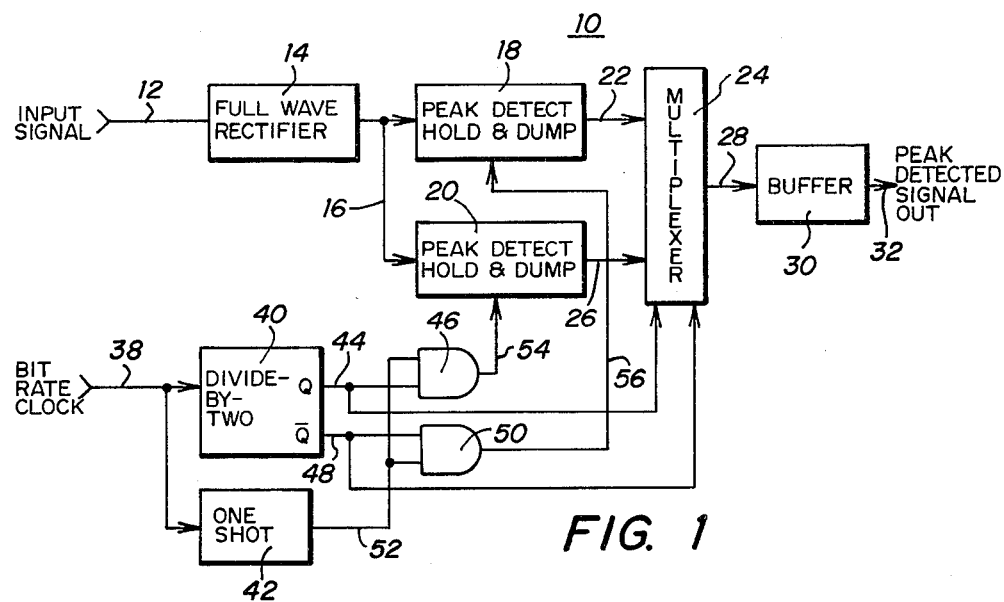
FIG. 1 is a block diagram of a fast updating peak detector circuit in accordance with the present invention.

Referring now to FIG. 1 a peak detector circuit 10 receives an input signal through a line 12 to a full-wave rectifier 14. The full-wave rectified input signal is transmitted from the output of rectifier 14 through a line 16 to a first peak detect, hold and dump circuit 18 and to a second peak detect, hold and dump circuit 20. Circuits 18 and 20 detect the peak amplitude of the rectified input signal and hold the peak amplitude until a dump command is received which discharges the peak amplitude which has been held.

Circuit 18 produces a first peak signal which is transmitted through a line 22 to a multiplexer circuit 24. A second peak signal is produced by circuit 20 and transmitted through a line 26 to the multiplexer 24. The first and second peak signals are alternately connected through a line 28 to a buffer circuit 30. The buffer circuit 30 is connected to an output terminal 32 at which is produced the peak detected signal for the input signal which is received through line 12.

A bit rate clock signal is transmitted through a line 38 to a divide-by-two circuit 40. The bit rate clock signal is also transmitted to a one shot circuit 42. A positive half rate clock signal is produced at the Q terminal output of circuit 40 and transmitted through a line 44 to the first input of an AND gate 46. An inverse half rate clock signal is produced at the $\overline{Q}$ terminal and transmitted through a line 48 to a first input of an AND gate 50. The output of the one shot circuit 42 is transmitted through a line 52 as the second inputs to gates 46 and 50.

The output of AND gate 46 is transmitted through a line 54 and serves as the dump command to peak detect, hold and dump circuit 20. Likewise, the output of AND gate 50 is transmitted through a line 56 to serve as the dump command for peak detect, hold and dump circuit 18.

The positive half rate clock signal is also transmitted through line 44 as a first input to control the operation of the multiplexer circuit 24. The inverse half rate clock signal is transmitted through line 48 as a second input to control the operation of multiplexer 24.

Figure 2:
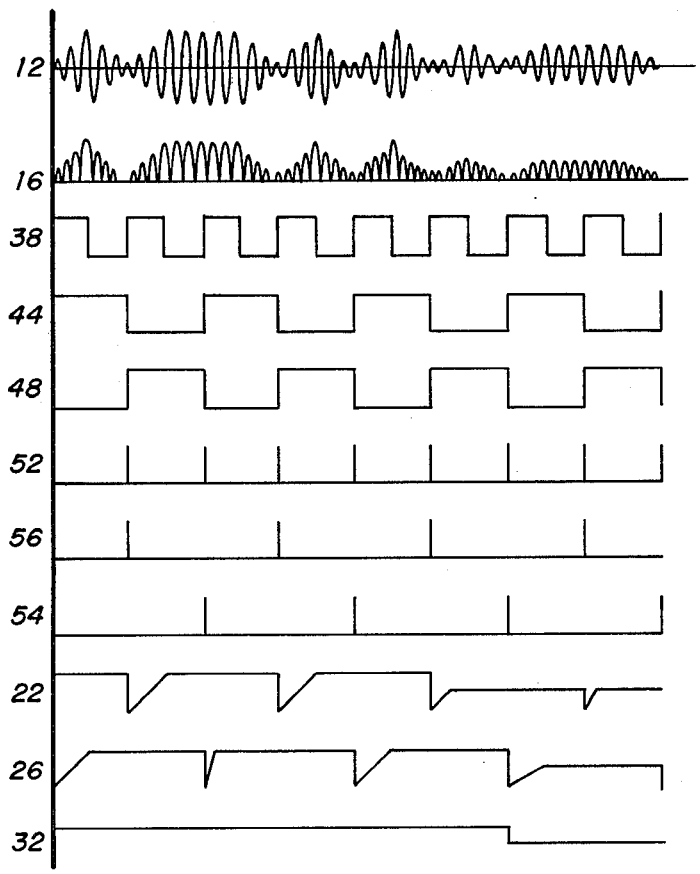
FIG. 2 is a collection of waveforms illustrating signals at various points of the circuit shown in FIG. 1.

Representative waveforms for the signals in the circuit of FIG. 1 are shown in FIG. 2. Each of the waveforms is numbered according to the reference numeral of the line or node at which the waveform is present.

Operation of the peak detector circuit 10 is now described in reference to FIGS. 1 and 2. Detector 10 is designed to accommodate a wide range in types of input signals. The particular input signal illustrated for line 12 is a PSK signal in which there can be a substantial difference in energy content for different bits. The input signal is full wave rectified by rectifier circuit 14 to produce the signal shown for line 16. The rectified input signal is provided simultaneously to circuits 18 and 20. Each of the circuits 18 and 20 detect and hold the peak amplitude of the rectified signal received by the circuit. The circuits 18 and 20 are reset by dump commands which are received through lines 56 and 54, respectively. Upon receipt of the dump command the output of the circuit 18 or 20 is pulled to a preset level, typically ground, and then permitted to again detect and hold the peak value of the rectified input signal. As can be seen by the signals on lines 54 and 56, the peak detect and hold circits 18 and 20 are reset alternately.

The multiplexer 24 is operated by signals received through lines 44 and 48 such that the lines 22 and 26 are alternately connected to line 28. Thus, the peak signals produced by circuits 18 and 20 are alternately connected to line 28. Line 28 is connected through buffer amplifier 30 to the output terminal 32.

The timing of the operation of the dump commands and the operations of multiplexer 24 is carried out in response to a bit rate clock signal which is transmitted through line 38 to circuits 40 and 42. The divide-by-two circuit 40 produces half rate clock signals 44 and 48 each of which is the inverse of the other. The signals on lines 44 and 48 are utilized directly by multiplexer 24 to alternately connect lines 22 and 26 to line 28. The bit rate clock signal is also transmitted to a one shot circuit 42 which produces a positive impulse at each positive transition of the bit rate clock signal. These positive-going impulses together with the half rate clock signals are provided to AND gates 46 and 50. These AND gates serve to produce positive-going impulse signals at half the rate of the impulse signals from circuit 42. The impulse signals produced on lines 54 and 56 are offset by 180° due to the inverse signals provided to AND gates 46 and 50 through lies 44 and 48. These positive-going impulses on lines 54 and 56 serve as the dump commands for peak detect and hold circuits 18 and 20. From the signals on lines 54 and 56 it can be seen that the circuits 18 and 20 receive the dump commands at alternating times.

Referring to the signal shown for line 22 it can be seen that the peak signal produced by circuit 18 is reset to a low level upon receipt of each dump command through line 56. Following receipt of the dump command the signal at line 22 is rapidly charged to the peak value of the rectified signal received by circuit 18. Likewise referring to the signal on line 26 it can be seen that upon receipt of the dump command the signal on line 26 is reset to a low level. It then rapidly charges to the peak level of the rectified signal on line 16. Note that following the third dump command impulse on line 54 the signal on line 26 charges to a peak amplitude which is less than the previous peak values.

The multiplexer 24 acts to alternately transmit the peak signals from circuits 18 and 20 to the output terminal 32. The signals on lines 28 and 32 are the same. Each of the peak signals on lines 22 and 26 is divided into intervals approximately defined by the dump commands. The intervals for the signal on line 22 have the same duration as the intervals for the signal on line 26, however, the intervals for the two lines are offset by 180°. The reset command is received at the very start of each interval and is immediately followed by the charging of the peak signal to the peak value of the rectified signal. At approximately the middle of each interval the peak signals on lines 22 and 26 are connected through multiplexer 24 to the output terminal 32. Thus the dumping and recharging for each of the peak signals occurs during a time period of each interval when the peak signal is not connected to the output terminal. The output signal thus can have transitions between amplitudes states but does not have the transitions caused by discharging the peak signal and the initial recharging of the peak signal. Further note by comparing the signals on lines 32 and 22 that the output peak amplitude of circuit 10 can be delayed by as much as one period of the rate clock on line 38.

Figure 3:
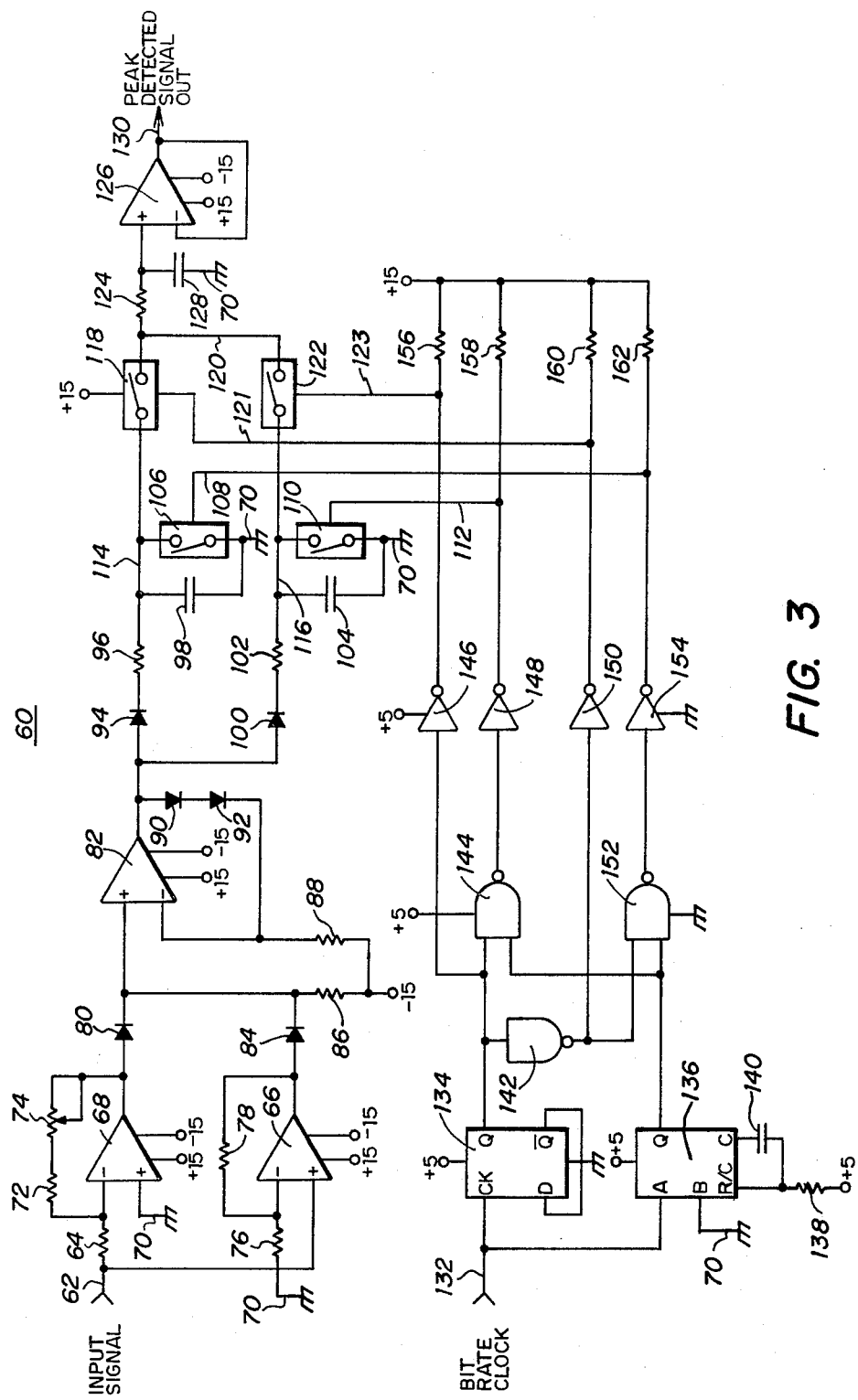
FIG. 3 is a detailed schematic diagram of a fast updating peak detector in accordance with the present invention.

A detailed schematic illustration of a fast peak detector circuit in accordance with the present invention is illustrated in FIG. 3. The device as a whole is represented by the reference numeral 60. An input signal is transmitted through a line 62 to a resistor 64 and to the non-inverting input of an operational amplifier 66. Resistor 64 is connected to the inverting input of an operational amplifier 68 which has a non-inverting input connected to a ground node 70. A resistor 72 is connected in series with a potentiometer 74 between the output terminal of operational amplifier 68 an the inverting input terminal thereof.

The inverting input to operational amplifier 66 is connected to a first terminal of a resistor 76 which has the second terminal connected to the ground node 70. A feedback resistor 78 is connected between the output terminal of operational amplifier 66 and the inverting input terminal.

The output terminal of operational amplifier 68 is connected to the anode terminal of a diode 80 which has the cathode terminal thereof connected to the non-inverting input of an operational amplifier 82. The output terminal of operational amplifier 66 is connected to the anode terminal of a diode 84 which has the cathode terminal thereof connected to the non-inverting input of operational amplifier 82.

The non-inverting input terminal of operational amplifier 82 is connected through a resistor 86 to a −15 volt supply terminal. The inverting input of operational amplifier 82 is connected through a resistor 88 to the −15 volt supply terminal. Diodes 90 and 92 are connected in a foward biased arrangement between the output terminal of operational amplifier 82 and the inverting input terminal thereof.

The output signal from operational amplifier 82 is transmitted serially through a diode 94 and a resistor 96 to the first terminal of a capacitor 98. The second terminal of capacitor 98 is connected to the ground node 70. The output signal from operational amplifier 82 is also transmitted serially through a diode 100 and a resistor 102 to the first terminal of a capacitor 104. The second terminal of capacitor 104 is connected to the ground node 70.

A single pole switch 106 has the terminals thereof connected in parallel with capacitor 98. Control signals for operating switch 106 are transmitted through a line 108. A single pole switch 110 has the terminals thereof connected in parallel with capacitor 104 and is connected to receive control signals through a line 112.

The terminal of capacitor 98 which receives the input signal is designated as node 114. The terminal of capacitor 104 which receives the input signal is designated as node 116.

Node 114 is connected to the first terminal of a single pole switch 118 which has the second terminal thereof connected to a node 120. Operation of switch 118 is controlled through a line 121. The node 116 is connected to the first terminal of a single pole switch 122 which has the second terminal thereof connected to the node 120. Operation of switch 122 is controlled through a line 123. The signal from node 120 is transmitted through a resistor 124 to the non-inverting input of an amplifier 126. A capacitor 128 is connected between the non-inverting input of amplifier 126 and the ground node 70. The output terminal 130 of peak detector circuit 60 is connected to the output terminal of operational amplifier 126. It is also directly connected to the inverting input terminal of amplifier 126.

Although mechanical symbols are shown for switches 106, 110, 118 and 122, these switches can be electronic switches such as field effect transistors.

A bit rate clock signal is transmitted through a line 132 to the CK input of a flip-flop 134. The D and $\bar{Q}$ terminals of circuit 134 are connected together.

The bit rate clock signal is also transmitted through line 132 to the "A" terminal of a one shot circuit 136. The "B" terminal of circuit 136 is connected to the ground node 70. Terminal "R/C" is connected through a resistor 138 to +5 volt source. A capacitor 140 is connected between terminal "R/C" and terminal "C" of one-shot circuit 136.

The signal produced at the Q output terminal of flip-flop 134 is a clock signal at one half of the rate of the bit rate clock signal transmitted through line 132. The half rate clock signal is transmitted from the Q terminal of circuit 134 to the input of a NAND gate used as an inverter 142 which produces the inverse of the half rate clock signal at the output thereof. The Q terminal of circuit 134 is further connected to the first input of a NAND gate 144 and to the input of an inverter 146. The Q output of one-shot circuit 136 is connected as the second input to NAND gate 144.

The output from NAND gate 144 is connected to the input of an inverter 148. The output of inverter 142 is connected to the input of an inverter 150 and is also connected to the first input of a NAND gate 152. The second input of NAND gate 152 is connected to the Q output of circuit 136. The output of NAND gate 152 is connected to the input of an inverter 154.

The outputs of inverters 146, 148, 150 and 154 are connected respectively to the first terminals of resistors 156, 158, 160 and 162. The second terminals of these resistors are connected to a +15 volt power supply. The output of inverter 146 is connected to control line 123 of switch 122. The output of inverter 148 is connected to control line 112 of switch 110. The output of inverter 150 is connected to control line 121 of switch 118 and the output of inverter 154 is connected to control line 108 of switch 106.

Each of the operational amplifiers shown in FIG. 3 has positive and negative 15 volt power terminals connected thereto. The flip-flop 134, one-shot circuit 136 and inverters 146, 148, 150 and 154 are each provided with connections to a +5 volt supply.

In a design example the operational amplifiers shown in FIG. 3 can be a model LM1558 manufactured by National Semiconductor. The one-shot circuit 136 can be a model SN74121 manufactured by Texas Instruments. The switches 106, 110, 118 and 122 can be a model CD4066 manufactured by RCA.

Operation of the peak detector circuit 60 is now described in reference to FIG. 3. The functional operation of circuit 60 is basically the same as that described above for the detector circuit 10 in FIG. 1. The input signal, which can have any of a wide variety of modulation formats is transmitted through line 62 to operational amplifiers 66 and 68 which function together with the peripheral circuitry to form a full-wave rectifier. The potentiometer 74 is provided for balancing the operation of amplifier 66 and 68. The full wave rectified signal is produced at the non-inverting input terminal to amplifier 82. The function of diodes 90 and 92 is to form a positive 2 diode drop offset at the output of amplifier 82 which counteracts the negative offsets caused by diodes 80 and 84 and diodes 94 and 100.

From the output of amplifier 82 the rectified input signal is transmitted to first and second peak detect, hold and dump circuits. The first such circuit comprises basically diode 94, resistor 96, capacitor 98 and switch 106. The second circuit comprises diode 100, resistor 102, capacitor 104 and switch 110. The rectified input signal forward biases the diodes 94 and 100 to charge the capacitors 98 and 104. The diodes prevent discharge of the capacitors such that the charge on the capacitor, the peak signal, is approximately equal to the highest amplitude of the rectified input signal. The closure of switch 106 in response to a dump command pulse causes the terminals of capacitor 98 to be shorted thereby grounding node 114 and pulling the peak signal to ground level. Likewise, the switch 110 responds to a dump command pulse to ground node 116 thereby discharging capacitor 104.

The nodes 114 and 116, which carry the peak signals, are connected to switches 118 and 122 respectively. The switches 118 and 122 are operated in response to the inverse clock signals such that one is closed when the other is open. The switches operate alternately to connect nodes 114 and 116 to apply the peak signals to amplifier 126. The amplifier 126 functions essentially as a buffer to provide a high impedance for the peak signals on nodes 114 and 116. The output terminal 130 is effectively connected to nodes 114 and 116 on alternate intervals by operation of switches 118 and 122. These switches are operated in such a time sequence, as described above, such that the capacitor, 98 or 104, not connected to the output terminal 130 is the one which receives the dump command. Therefore, the output terminal 130 is not connected to the charge capacitor, 98 or 104, at the time the capacitor is discharged or during its initial charging to the peak amplitude of the rectified input signal.

The timing control for operation of dump commands and the multiplexer switches is derived from the bit rate clock signal which is provided through line 132. The bit rate clock and the half rate clock signals produced by flip-flop 134 and inverter 142 correspond respectively to the signals on lines 38, 44 and 48 shown in FIG. 2. The signal at the Q terminal of one-shot circuit 136 corresponds to the signal on line 52 as shown in FIG. 2. The half rate clock signals thus produced are transmitted through inverter circuits 146 and 150 and are used to drive the switches 118 and 122. The NAND gates 144 and 152 receive the half rate clock signals and the impulse signals produced by circuit 136. The output signals produced by gates 144 and 152 correspond to the signals shown for lines 54 and 56 respectively in FIG. 2. These impulse signals are utilized as the dump commands for operating switches 106 and 110 to discharge the storage capacitors.

In summary, the present invention comprises a method and apparatus for fast peak detecting an analog signal in which peak signals are alternately reset to ground at periodic intervals. The output terminal is connected to receive the peak signals during such portions of the charging intervals such that the discharge and charge transitions are not transmitted to the output terminal.

Although several embodiments of the invention have been illustrated in the accompanying drawings and described in the foregoing detailed description, it will be understood that the invention is not limited to the embodiments disclosed but is capable of numerous rearrangements, modifications and substitutions without departing from the scope of the invention.

I claim:

1. A peak detector circuit, comprising:
    means for rectifying an input signal to produce a rectified signal;
    first means connected to receive said rectified signal for detecting and holding the peak amplitude of said rectified signal to produce a first peak signal;
    second means connected to receive said rectified signal concurrently with said first means for detecting and holding the peak amplitude of said rectified signal to produce a second peak signal;
    means for alternately connecting said first and second peak signals to an output terminal; and
    means for alternately resetting said first and second peak signals to a preset level wherein each of said peak signals is reset when the other of said peak signals is connected to said output terminal.

2. The peak detector circuit recited in claim 1 wherein said means for rectifying comprises a full wave rectifier.

3. The peak detector circuit recited in claim 1 wherein said first and said second means for detecting each comprises the combination of a diode connected to receive said rectified signal for charging a capacitor connected to said diode.

4. The peak detector circuit recited in claim 3 wherein said means for resetting comprises a switch for shorting each of said capacitors, each switch operated by a separate pulse signal, each said pulse signal out-of-phase with the other pulse signal.

5. The peak detector circuit recited in claim 1 wherein said means for alternately connecting comprises first and second switches having the inputs thereof connected to receive said first and second peak signals respectively, said switches having the outputs thereof connected to said output terminal, said switches connected respectively to receive first and second clock signals, said first and second switches driven by said first and second clock signals respectively, said first clock signal at approximately the same rate but out-of-phase with said second clock signal.

6. A peak detector circuit, comprising:
    a full-wave rectifier connected to receive an input signal and produce a full-wave rectified signal;
    a first peak detect and hold circuit connected to receive said rectified signal and hold the peak amplitude thereof as a first peak signal;
    a second peak detect and hold circuit connected to receive said rectified signal concurrently with said first peak detect and hold circuit and hold the peak amplitude thereof as a second peak signal;
    switch means operated in response to a reference clock signal for alternately connecting said first and said second peak signals to an output terminal; and
    means responsive to said reference clock signal for alternately and periodically pulling said first and said second peak signals to a common potential wherein the peak signal being pulled to the common potential is not connected to said output terminal.

7. The peak detector circuit recited in claim 6 wherein said means for pulling said first and said second peak signals to a common potential comprises first and second switches operated by phase offset clock signals derived from said reference clock signal, said means for pulling for alternately discharging said first and said second peak signals.

8. A method for peak detecting an input signal, comprising the steps of:
    rectifying said input signal to produce a rectified input signal;
    detecting and holding the peak amplitude of said rectified input signal to produce a first peak signal;
    detecting and holding the peak amplitude of said rectified input signal to produce a second peak signal concurrent with producing said first peak signal;
    alternately connecting said first and said second peak amplitude signals to an output terminal, and
    periodically resetting each of said peak signals to a preset level at a time when the peak signal is not connected to said output terminal.

9. The method recited in claim 8 wherein said steps of detecting and holding each comprises applying said rectified input signal through a diode to charge a capacitor.

10. The method recited in claim 9 wherein the step of resetting comprises periodically and alternately discharging said capacitors.

11. A method for peak detecting an input signal, comprising the steps of:
    full-wave rectifying the input signal to produce a rectified input signal;
    detecting and holding the peak amplitude of said rectified input signal to produce a first peak signal;
    detecting and holding the peak amplitude of said rectified input signal to produce a second peak signal, said second peak signal produced concurrently with said first peak signal;
    resetting each of said peak signals to ground potential in response to a clock signal, and
    alternately connecting each of said peak signals to an output terminal wherein said resetting occurs when the peak signal is not connected to said output terminal.

12. The method recited in claim 11 wherein the steps of detecting and holding each comprises routing said rectified input signal through a diode to charge a capacitor.

13. The method recited in claim 11 wherein said first peak signal is produced during first periodic intervals and said second peak signal is produced during second periodic intervals, said first and second periodic intervals being offset by approximately 180°, said peak signals being connected to said output terminal during a second half of each of said intervals and said resetting occurring during a first half of each of said intervals.

* * * * *